(12) United States Patent
Izumi

(10) Patent No.: US 8,159,127 B2
(45) Date of Patent: Apr. 17, 2012

(54) DISPLAY APPARATUS

(75) Inventor: Nozomu Izumi, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 62 days.

(21) Appl. No.: 12/819,087

(22) Filed: Jun. 18, 2010

(65) Prior Publication Data

US 2010/0320909 A1  Dec. 23, 2010

(30) Foreign Application Priority Data

Jun. 23, 2009  (JP) .................... 2009-149054

(51) Int. Cl.
*H01J 1/62* (2006.01)

(52) U.S. Cl. .................. 313/504; 313/506; 313/509

(58) Field of Classification Search ........... 313/498–512
See application file for complete search history.

(56) References Cited

U.S. PATENT DOCUMENTS

| | | | |
|---|---|---|---|
| 2005/0023964 A1 | 2/2005 | Omura | |
| 2005/0218796 A1 | 10/2005 | Kubota | |
| 2005/0242720 A1* | 11/2005 | Sano et al. | 313/506 |
| 2006/0158077 A1* | 7/2006 | Yokoyama et al. | 313/112 |
| 2011/0031514 A1 | 2/2011 | Sakaguchi | |
| 2011/0079797 A1 | 4/2011 | Sumida | |

FOREIGN PATENT DOCUMENTS

| | | |
|---|---|---|
| JP | 2003-282240 A | 10/2003 |
| JP | 2004-335267 A | 11/2004 |

* cited by examiner

*Primary Examiner* — Bumsuk Won

(74) *Attorney, Agent, or Firm* — Canon U.S.A., Inc., IP Division

(57) ABSTRACT

Display apparatuses are enhanced in reliability in such a manner that external moisture is prevented from penetrating display regions and planarization layers are prevented from being stripped off. In particular, in a display apparatus including a display region containing organic light-emitting devices arranged on a circuit substrate, a bank-separating region separating a bank is provided in a planarization layer-separating region separating a planarization layer, an end portion of the planarization layer is covered with the bank, an end portion of an organic protective layer extending over the display region is spaced from a portion of the planarization layer that is located outside the bank-separating region and a portion of the bank that is located outside the bank-separating region, and the inorganic protective layer and an end portion of the bank that is disposed in the display region are covered with an inorganic protective layer.

4 Claims, 4 Drawing Sheets

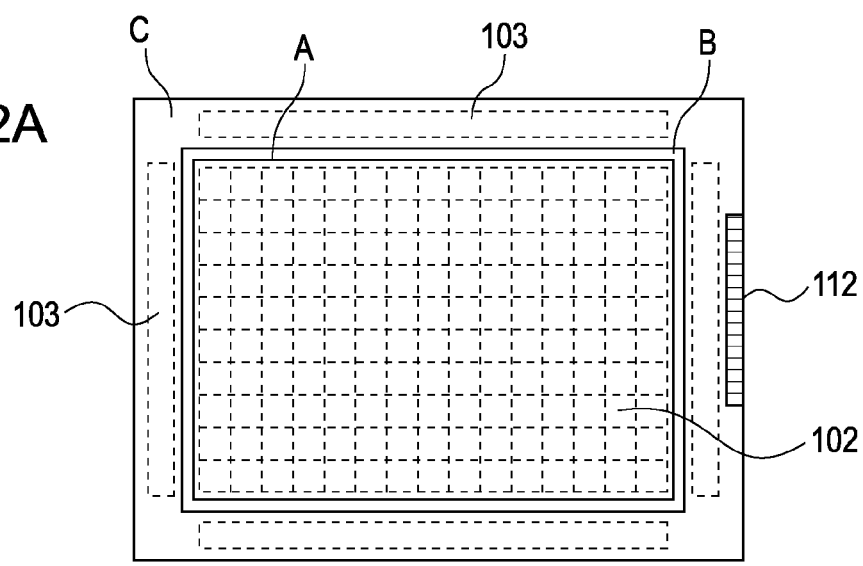
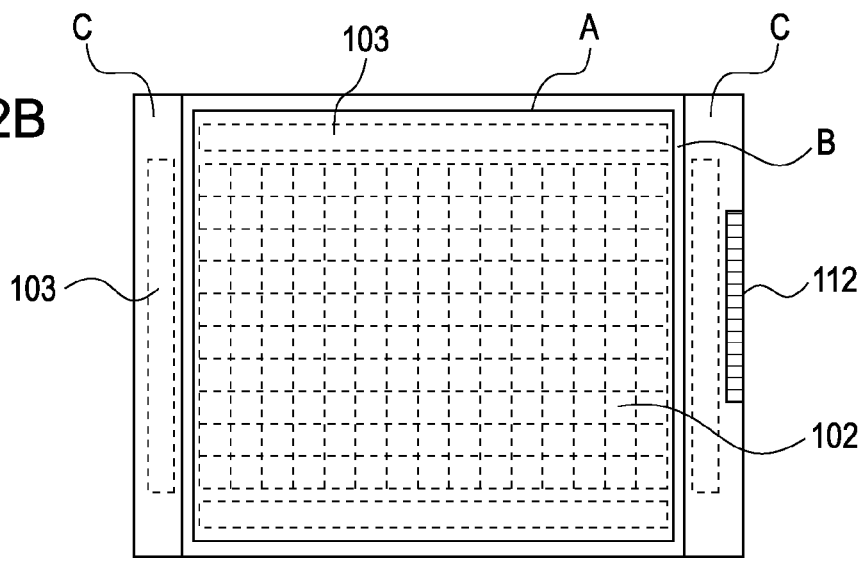
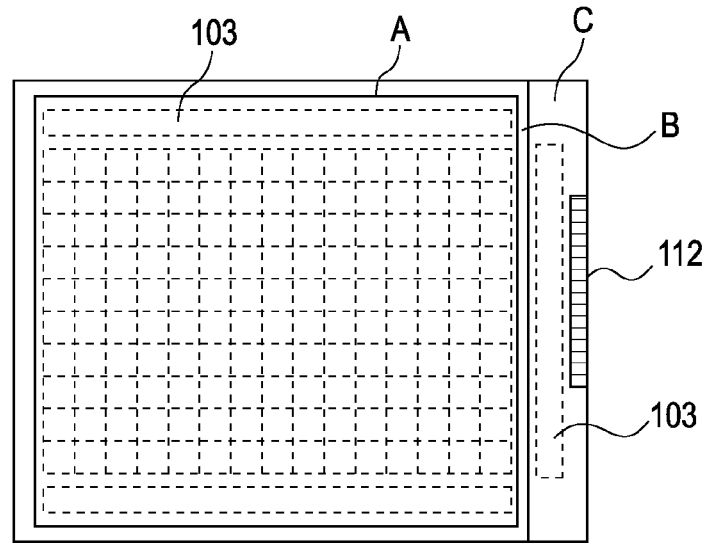

DISPLAY APPARATUS

BACKGROUND OF THE INVENTION

1. Field of the Invention

The present invention relates to a display apparatus including organic light-emitting devices.

2. Description of the Related Art

In recent years, much attention has been focused on display apparatuses including self-luminous organic electroluminescent devices in view of power saving and thickness reduction. A display apparatus includes a plurality of organic light-emitting devices which are arranged in a display region and which each include a pair of electrodes and an organic light-emitting layer sandwiched therebetween.

The organic light-emitting devices are extremely sensitive to moisture and oxygen. The presence of moisture in the organic light-emitting devices causes deteriorations; hence, non-luminous region called dark spots are caused in the organic light-emitting devices and/or the light emission efficiency of the organic light-emitting devices is reduced. Since such deteriorations cause a reduction in display function, the following configuration is used: a sealing configuration in which a sealing substrate with high moisture barrier properties is bonded to a substrate to cover the display region such that moisture and oxygen are prevented from penetrating the organic light-emitting devices.

For the purpose of increasing the percentage of a light extraction area, top emission-type organic luminescent display apparatuses are under development. A top emission-type organic luminescent display apparatus includes driving circuits including thin-film transistors (TFTs) and the like and organic light-emitting devices arranged above the driving circuits. Layers included in the organic light-emitting devices are extremely thin and therefore are readily broken by irregularities due to the driving circuits. Therefore, the irregularities due to the driving circuits are usually planarized in such a manner that the driving circuits are covered with a planarization layer made an organic material.

The planarization layer has a function of protecting the driving circuit from damage during processing. In order to omit an unnecessary space in a surface of a substrate, the driving circuits are arranged over the substrate and the planarization layer usually extends over the substrate.

When the planarization layer continuously extends over the substrate, the planarization layer has an exposed portion extending out of an sealing substrate and moisture and the like penetrate the exposed portion. The moisture and the like penetrating the planarization layer reach the organic light-emitting devices to cause the deterioration of the organic light-emitting devices. Japanese Patent Laid-Open No. 2004-335267 discloses a technique in which a separating region is provided around a display region by partly removing a planarization layer and a sealing substrate is bonded to a portion of a substrate that is located outside the separating region as shown in FIG. 5. The separating region is disposed in the planarization layer and blocks a moisture pathway extending in the planarization layer; hence, organic light-emitting devices can be prevented from being deteriorated by moisture and/or the like.

Japanese Patent Laid-Open No. 2003-282240 discloses another technique for protecting organic light-emitting devices from moisture, that is, a sealing configuration in which a display region is covered with an organic protective layer made of an organic material and the organic protective layer, a peripheral portion thereof, and a surrounding portion thereof are covered with an inorganic protective layer. After irregularities caused by inclusions adhering to a surface of the display region during processing are planarized with the organic protective layer, the organic protective layer is covered with the inorganic protective layer, which has high moisture barrier properties. Therefore, defects caused in the inorganic protective layer by surface irregularities can be reduced, resulting in increases in moisture barrier properties of the inorganic protective layer.

In view of thickness reduction, weight reduction, cost reduction, a sealing technique using a protective layer including an organic protective sub-layer and an inorganic protective sub-layer deposited thereon is more preferable than a sealing technique using a sealing substrate. In the case of sealing a display apparatus including a planarization layer continuously extending over a substrate, the direct application of the technique disclosed in Japanese Patent Laid-Open No. 2003-282240 is not effective in obtaining sufficient sealing properties. This is because although the display region is covered with the organic protective layer and the organic protective layer, a peripheral portion thereof, and a surrounding portion thereof are covered with the inorganic protective layer, moisture and the like penetrate the display region through the planarization layer.

In the technique disclosed in Japanese Patent Laid-Open No. 2004-335267, the substrate, which has the planarization layer having the separating region, is sealed. If the organic protective layer extends across the separating region, moisture and the like penetrate the display region through the planarization layer and the organic protective layer. An etchant penetrates an end portion of the planarization layer that is in contact with the separating region and therefore the planarization layer is likely to be stripped off. This causes a problem that a driving circuit cannot be sufficiently protected and the display performance of a display apparatus cannot be secured.

SUMMARY OF THE INVENTION

The present invention provides a display apparatus below. The display apparatus includes a circuit substrate including a driving circuit; a planarization layer extending over the driving circuit; a plurality of organic light-emitting devices arranged on the planarization layer; a display region containing the organic light-emitting devices; a bank which is disposed on the planarization layer, which has a plurality of openings corresponding to light-emitting regions of the organic light-emitting devices, and which is made of an organic material; an organic protective layer which extends over the display region and which is made of an organic material; an inorganic protective layer which extends over the organic protective layer and which is made of an inorganic material; a planarization layer-separating region separating the planarization layer into a portion disposed in the display region and a portion disposed in a peripheral region; and a bank-separating region separating the bank into a portion disposed in the display region and a portion disposed in the peripheral region. The bank-separating region is disposed in the planarization layer-separating region. The planarization layer has an end portion which extends along the bank-separating region and which is covered with the bank. The organic protective layer is spaced from the portion of the planarization layer that is disposed in the peripheral region and the portion of the bank that is disposed in the peripheral region. The inorganic protective layer extends over an end portion of the organic protective layer and an end portion of the bank that is disposed in the display region.

According to the present invention, an end portion of a planarization layer is covered with a bank. Since the bank prevents an etchant and the like from penetrating the end portion of the planarization layer to prevent the planarization layer from being stripped off, a driving circuit can be sufficiently protected. An end portion of an organic protective layer is spaced from the planarization layer and the bank, which are disposed outside a moisture-blocking region; hence, moisture can be prevented from penetrating a member made of an organic material. This enables the manufacture of a display apparatus in which organic light-emitting devices are prevented from being deteriorated by moisture and which has high reliability.

Further features of the present invention will become apparent from the following description of exemplary embodiments with reference to the attached drawings.

BRIEF DESCRIPTION OF THE DRAWINGS

FIGS. 2A to 2C are illustrations of examples of the layout of a planarization layer used herein.

DESCRIPTION OF THE EMBODIMENTS

Embodiments of the present invention will now be described. In particular, components are described with reference to FIGS. 1A and 1B and methods of fabricating the components are then described.

Figure 1A:
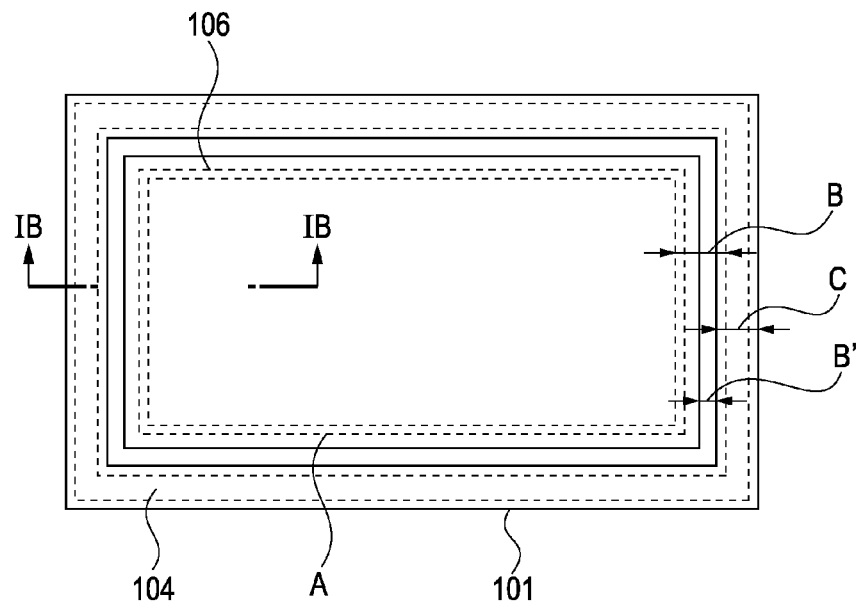
FIG. 1A is a plan view of a display apparatus according to an embodiment of the present invention.
Figure 1B:
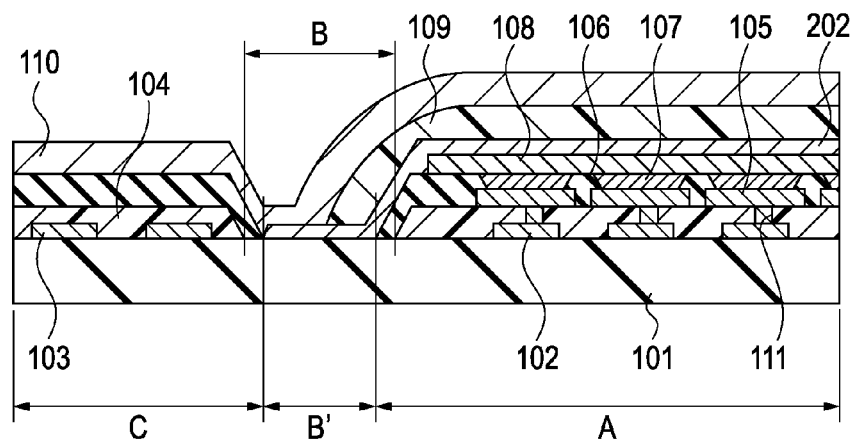
FIG. 1B is a sectional view of the display apparatus taken along the line IB-IB of FIG. 1A.

FIG. 1A is a plan view of a display apparatus according to an embodiment of the present invention. FIG. 1B is a sectional view of the display apparatus taken along the line IB-IB of FIG. 1A. The display apparatus includes a display region A in which a plurality of organic light-emitting devices are arranged.

(Circuit Substrate)

In the present invention, an undercoat layer (not shown) made of an inorganic material is formed on an insulating support substrate 101 made of glass such that TFTs are not negatively affected by impurities contained in the insulating support substrate 101. Driving circuits for operating the organic light-emitting devices and external connection terminals 112 are formed on the undercoat layer. The term "driving circuits" as used herein refers to pixel circuits 102 which are arranged in the display region A so as to correspond to the organic light-emitting devices, peripheral circuits 103 for driving the pixel circuits 102, or both of the pixel circuits 102 and the peripheral circuits 103. The pixel circuits 102 are electrically connected to the peripheral circuits 103 through interconnects, which are not shown. The driving circuits may be active matrix circuits including TFTs made of polycrystalline silicon (hereinafter referred to as p-Si) or single-crystalline silicon (hereinafter referred to as a-Si). The TFTs may have a known configuration including a silicon layer, a gate oxide layer, an interlayer insulating layer, and the like. The insulating support substrate 101 having the driving circuits is hereinafter simply referred to as a circuit substrate. The TFTs can be enhanced in reliability in such a manner that the circuit substrate is covered with an inorganic insulating layer made of silicon nitride or silicon dioxide.

(Planarization Layer)

A planarization layer 104 made of an acrylic resin or a polyimide resin is formed on a surface of the circuit substrate that has the driving circuits. A planarization layer-separating region B is formed in such a manner that a region which extends around the display region A and which contains no driving circuit is removed from the planarization layer 104. The planarization layer-separating region B separates the planarization layer 104 into a portion disposed in the display region A and a portion disposed in a peripheral region C.

As shown in FIG. 2A, the planarization layer-separating region B is preferably provided between the pixel circuits 102 and the peripheral circuits 103. Alternatively, as shown in FIG. 2B, the planarization layer-separating region B may be formed such that the display region A contains some of the peripheral circuits 103 and the planarization layer-separating region B contains the other peripheral circuits 103. When the peripheral circuits 103 are not arranged around the display region A but are arranged in a portion around the display region A as shown in FIG. 2C, the planarization layer 104 need not be formed on a region containing no peripheral circuit. In other words, in the configuration shown in FIG. 2B or 2C, the planarization layer-separating region B may be formed in a necessary portion around the display region A. However, the planarization layer 104 may be formed so as to extend on a region containing no peripheral circuit and the planarization layer-separating region B may be formed around the display region A.

Before the planarization layer-separating region B is formed by patterning, a plurality of contact holes 111 for electrically connecting the pixel circuits 102 to first electrodes 105 formed later are formed in a portion of the planarization layer 104 that is disposed in the display region A by patterning.

(First Electrodes)

The first electrodes 105 are formed on the planarization layer 104 so as to correspond to the organic light-emitting devices. The first electrodes 105 are connected to the pixel circuits 102 through the contact holes 111. The following materials can be used to form the first electrodes 105: known materials, such as Al, Ag, Au, ITO, IZO, and ZnO, for forming electrodes for organic light-emitting devices.

(Bank)

A bank 106 is formed on the planarization layer 104 and the first electrodes 105 so as to have openings corresponding to light-emitting regions of the organic light-emitting devices. The bank 106 extends over end portions of the first electrodes 105 and portions around the first electrodes 105 such that an organic compound layer formed later is not broken by bump portions due to the first electrodes 105. The bank 106 has a function of defining the light-emitting regions of the organic light-emitting devices. A region is formed around the display region A by partly removing the bank 106 as well as the planarization layer 104.

When the region formed by partly removing the bank 106 is disposed in the planarization layer-separating region B and have a width less than the width of the planarization layer-separating region B, an end portion of the planarization layer 104 that extends along the planarization layer-separating region B is covered with the bank 106. In the region formed by partly removing the bank 106, the planarization layer 104 and the bank 106 are partly removed and therefore the circuit substrate or the inorganic insulating layer is partly exposed.

The region formed by partly removing the bank 106 is hereinafter referred to as the bank-separating region B'.

An end portion of the planarization layer 104 that extends along the bank-separating region B' is covered with the bank 106. Therefore, the following problem can be prevented: a problem that an etchant penetrates an end portion of the planarization layer 104 during the patterning of the bank 106 to cause the planarization layer 104 to be readily stripped off. Furthermore, a function of protecting the driving circuits can be enhanced.

The bank 106 is preferably made of an organic insulating material. Preferred examples of the organic insulating material include resin materials such as acrylic resins and polyimide resins. When the bank 106 and the planarization layer 104 are made of the same material, the planarization layer 104 is preferably covered with the bank 106 so as to be protected because the planarization layer 104 is etched during the etching of the bank 106.

(Organic Compound Layers)

Organic compound layers 107 including organic light-emitting sub-layers are formed on the first electrodes 105. The organic compound layers 107 may include functional sub-layers such as hole injection sub-layers, hole transport sub-layers, electron injection sub-layers, and electron transport sub-layers in addition to the organic light-emitting sub-layers. Known materials can be used to form sub-layers included in the organic compound layers 107.

(Second Electrode)

A second electrode 108 is formed over the organic compound layers 107, whereby the organic light-emitting devices, which are each sandwiched between a pair of electrodes, are formed. The second electrode 108 may be made of the same material as that used to form the first electrodes 105. In order to extract light emitted from the organic light-emitting devices, either or both of the first electrodes 105 and the second electrode 108 need to be transparent. Therefore, a conductive oxide film made of ITO or IZO, a semitransparent conductive film including a metal thin-film made of Ag or Al, or a laminate including such films is preferably used to form the first electrodes 105 or second electrode 108 through which light is extracted includes.

(Protective Layer)

A protective layer including an organic protective sub-layer 109 and an inorganic protective sub-layer 110 is formed on the second electrode 108.

Before the step of forming the protective layer, the organic light-emitting sub-layers are formed on the circuit substrate through several patterning steps and vacuum deposition steps. Surfaces over which the protective layer to be formed have irregularities resulting from the adhesion of etching residue generated in these steps and films stripped from an inner wall of a vacuum apparatus. Differences in height between the irregularities depend on a process and conditions for manufacturing the vacuum apparatus and are usually 5 μm or less. If the irregularities are covered with only the inorganic protective sub-layer 110, the inorganic protective sub-layer 110 cannot sufficiently cover the irregularities and has defects, through which moisture passes, when the inorganic protective sub-layer 110 has a small thickness. If the inorganic protective sub-layer 110 is formed so as to have a thickness not less than the differences in height between the irregularities for the purpose of sufficiently cover the irregularities, the inorganic protective sub-layer 110 is likely to be cracked due to a large stress applied thereto and manufacturing tact and cost are increased.

Therefore, the irregularities are planarized by the formation of the organic protective sub-layer 109 in advance of the formation of the inorganic protective sub-layer 110. The organic protective sub-layer 109 is formed so as to have a thickness not less than differences in height between irregularities formed in the display region A. In consideration of differences in height between irregularities caused in common manufacturing steps and manufacturing cost, the organic protective sub-layer 109 preferably has a thickness of 5 μm to 30 μm.

The organic protective sub-layer 109 has an end portion which is disposed in the bank-separating region B' or the display region A and which is spaced from the planarization layer 104 and the bank 106. This is because if the organic protective sub-layer 109 is in contact with the planarization layer 104 or the bank 106, moisture penetrates the organic protective sub-layer 109 through the planarization layer 104 or the bank 106 to reach the display region A, thereby causing the deterioration of the organic light-emitting devices.

Since the organic protective sub-layer 109 preferably has a smooth surface with small irregularities, the following material is preferably used to form the organic protective sub-layer 109: a material which can be applied to a substrate in a liquid state and can be then cured into a solid. Examples of this material include polyolefin resins, polyether resins, epoxy resins, acrylic resins, and silicone resins.

The organic protective sub-layer 109 is covered with the inorganic protective sub-layer 110. The inorganic protective sub-layer 110 has high moisture barrier properties. The inorganic protective sub-layer 110 is formed in a region wider than the organic protective sub-layer 109 so as to be in contact with a portion of the circuit substrate or inorganic insulating layer that is exposed in the bank-separating region B'. A moisture pathway is blocked in such a manner that inorganic materials are contacted with each other in the bank-separating region B', whereby moisture can be prevented from penetrating the organic light-emitting devices. Silicon nitride, silicon dioxide, a mixture thereof, or a laminate is preferably used to form the inorganic protective sub-layer 110. Since a surface of the organic protective sub-layer 109 is smooth and flat, the inorganic protective sub-layer 110 can prevent the penetration of moisture when the inorganic protective sub-layer 110 has a thickness of 0.5 μm to 3 μm.

Figure 3A:
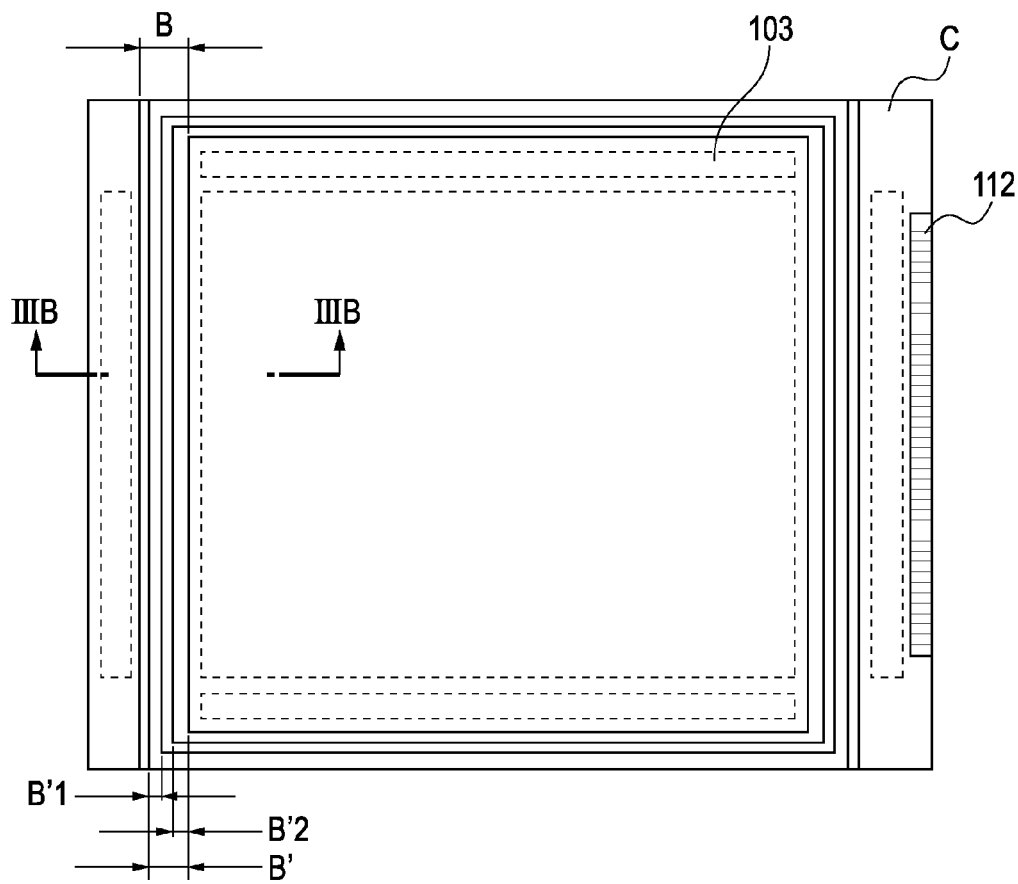
FIG. 3A is a plan view of a display apparatus manufactured in Example 2.
Figure 3B:
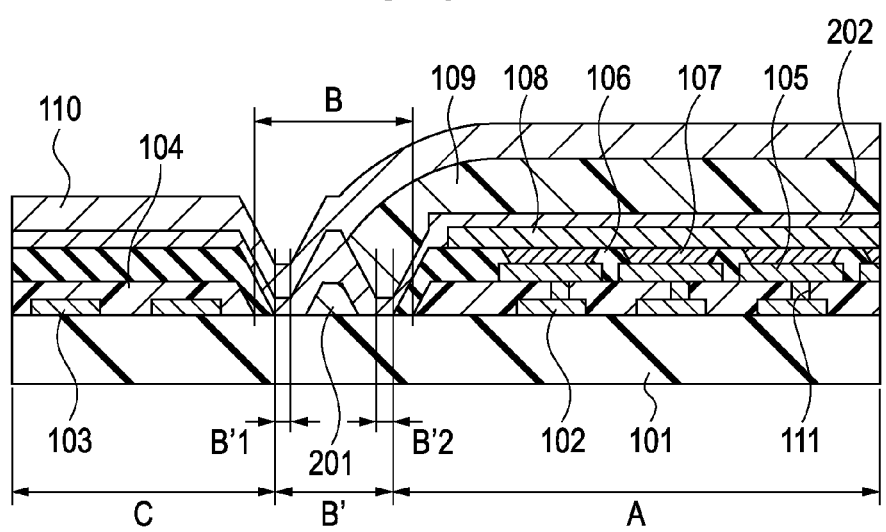
FIG. 3B is a sectional view of the display apparatus taken along the line IIIB-IIIB of FIG. 3A.

As shown in FIG. 3B, an inorganic underlayer 202 made of a material with high mechanical strength may be formed in the display region A in advance of the formation of the organic protective sub-layer 109. The presence of the inorganic underlayer 202 prevents shrinkage stress caused by curing a material for forming the organic protective sub-layer 109 or stress created in the cured material from propagating to the organic light-emitting devices; hence, defects due to peeling can be prevented. The presence of the inorganic underlayer 202 expands the range of the curing shrinkage of a material useful in forming the organic protective sub-layer 109 or the range of stress created in the organic protective sub-layer 109. Therefore, there is an advantage that the number of usable resin materials can be increased.

Aluminum oxide, silicon nitride, silicon dioxide, and/or the like can be used to form the inorganic underlayer 202. Unlike the inorganic protective sub-layer 110, the inorganic underlayer 202 need not have a function of preventing the penetration of moisture or the like. Therefore, the inorganic underlayer 202 may have a thickness of about 0.1 μm to 1 μm.

The inorganic underlayer 202 may be formed over the bank-separating region B' and the peripheral region C in addition to the display region A. In the case of forming the inorganic underlayer 202 over the bank-separating region B', the inorganic underlayer 202 has a portion which is in contact with the circuit substrate or the inorganic insulating layer and which is disposed in the bank-separating region B' and the inorganic protective sub-layer 110 has a region in contact with the inorganic underlayer 202. In this case, there is no organic material in the bank-separating region B' and the bank-separating region B' has a sub-region in which inorganic materials are in contact with each other; hence, moisture can be prevented from penetrating the display region A.

(Manufacturing Method)

A method of manufacturing the display apparatus will now be described.

The TFTs, the driving circuits, and the inorganic insulating layer can be formed on the insulating support substrate 101, which is made of glass or the like, by known processes.

In air, an organic material is applied to a surface of the circuit substrate that has the driving circuits using a spin coater and is then cured, whereby the planarization layer 104 is formed. A portion of the planarization layer 104 that extends around the display region A is removed by photolithography and the planarization layer-separating region B is patterned. In this step, the contact holes 111 are formed in a portion of the planarization layer 104 that is disposed in the display region A such that the contact holes 111 correspond to the pixel circuits 102.

The first electrodes 105 are formed by a process such as a sputtering process or a vapor deposition process at a temperature not affecting the planarization layer 104. For example, a laminate including an Al layer and an ITO layer is formed by a sputtering process and a pattern corresponding to the organic light-emitting devices is formed by photolithography. The first electrodes 105 are electrically connected to the pixel circuits 102 through the contact holes 111, which are arranged in the planarization layer 104.

The bank 106, as well as the planarization layer 104, is formed over the circuit substrate with a spin coater and is then patterned by photolithography. The openings and the bank-separating region B' are formed in the bank 106. The openings extend over end portions of the first electrodes 105 and correspond to the light-emitting regions of the organic light-emitting devices. The bank-separating region B' is provided in the planarization layer-separating region B. Therefore, a region formed by partly removing the planarization layer 104 and the bank 106 is disposed around the display region A and an end portion of the planarization layer 104 that extends along the bank-separating region B' is covered with the bank 106. After the bank 106 is patterned, moisture is removed from the planarization layer 104 and the bank 106 by annealing, whereby the organic light-emitting devices, which are formed later, are prevented from being deteriorated by moisture contained in the planarization layer 104 or the bank 106.

The organic compound layers 107 can be formed by a vapor deposition process, a laser transfer process, an ink jet coating process, or another process using known materials. In the case where the organic compound layers 107 are formed by the vapor deposition process so as to have different thicknesses and/or so as to contain different materials depending on the organic light-emitting devices, a metal mask is used. After the organic compound layers 107 are formed, steps are performed in an atmosphere with a controlled dew point until the formation of the inorganic protective sub-layer 110 such that moisture is prevented from penetrating the organic light-emitting devices during the steps.

The organic protective sub-layer 109 is formed so as to be spaced from a portion of the planarization layer 104 that is disposed in the peripheral region C and a portion of the bank 106 that is disposed in the peripheral region C. The organic protective sub-layer 109 is formed such that an end portion of the organic protective sub-layer 109 that is disposed in the bank-separating region B' is located closer to the display region A than the outer end of the bank-separating region B'. In order to formed an end portion of the organic protective sub-layer 109 at a predetermined position, the bank-separating region B' is formed with a graphic dispenser or by a screen printing process so as to have a large width in consideration of the coating accuracy of a coating unit. An increase in the width of the bank-separating region B' expands the frame of the display apparatus. Therefore, a high-accuracy coating unit is preferably used such that the bank-separating region B' has a width of 20 μm to 200 μm.

As a technique for determining the position of an end portion of the organic protective sub-layer 109, a three-dimensional structure may be provided at the position of an end portion of the organic protective sub-layer 109. Examples of the three-dimensional structure include grooves, dikes, and combinations thereof. The presence of the three-dimensional structure allows a resin material with low viscosity to be used to form the organic protective sub-layer 109 because the three-dimensional structure serves as a resistance to the expansion of an applied material on a coating surface and therefore the expansion thereof can be stopped at a predetermined position. In the case of using a low-viscosity material to form the organic protective sub-layer 109, a plurality of three-dimensional structures are preferably used.

A material for forming the bank 106 or a material for forming the planarization layer 104 is preferably used to form the three-dimensional structure because the three-dimensional structure can be formed together with the bank 106 or the planarization layer 104 and an additional process or material is unnecessary.

An applied material for forming the organic protective sub-layer 109 is cured by heating or UV irradiation.

Figure 4:
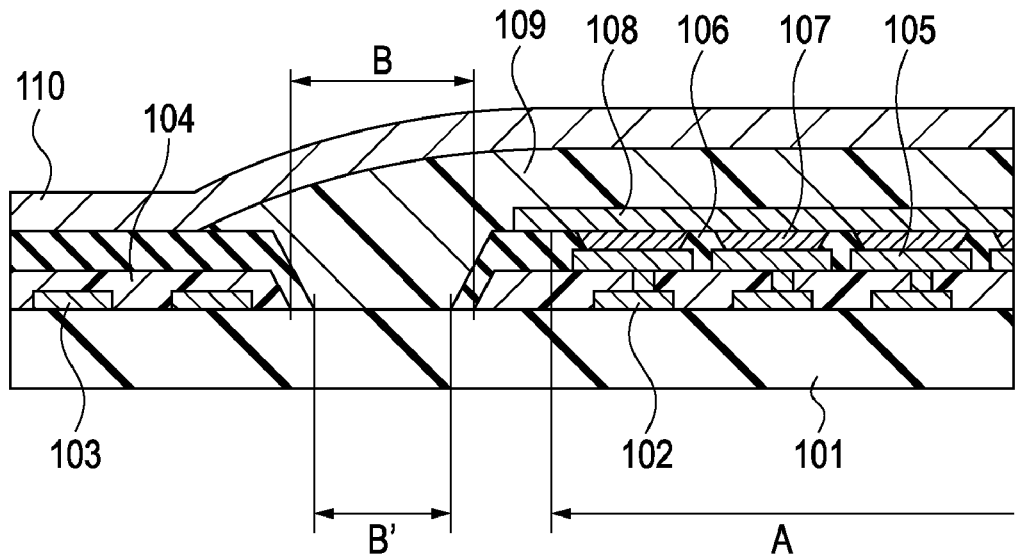
FIG. 4 is a partial sectional view of a display apparatus manufactured in a comparative example.
Figure 5:
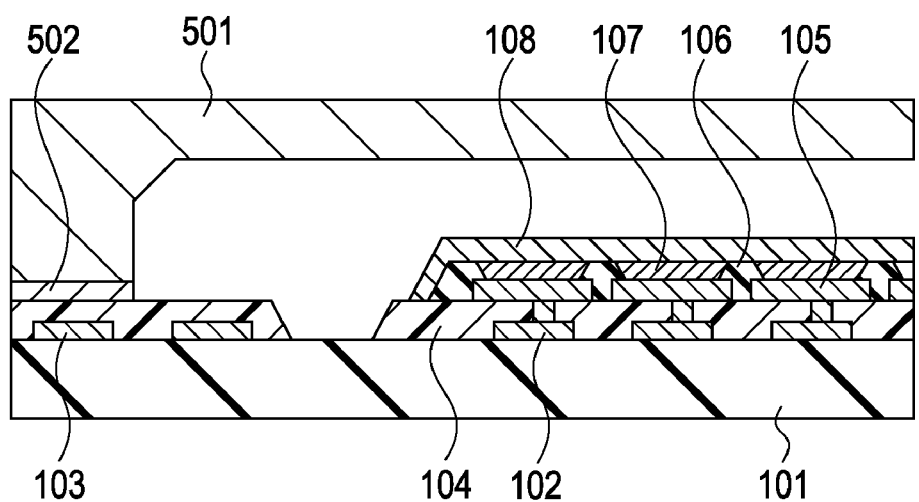
FIG. 5 is a partial sectional view of a conventional display apparatus.

A deposition process such as a plasma-enhanced chemical vapor deposition process or a sputtering process can be used to form the inorganic protective sub-layer 110 or the inorganic underlayer 202 shown in FIG. 4.

EXAMPLES

Example 1

Example 1 will now be described with reference to FIGS. 1A and 1B.

Driving circuits including TFTs made of p-Si are formed above a glass substrate having a length of 100 mm, a width of 100 mm, and a thickness of 0.5 mm, whereby a circuit substrate was obtained. A plurality of pixel circuits 102 were formed in a display region A and peripheral circuits 103 for driving the pixel circuits 102 were formed in a peripheral region C surrounding the display region A. An inorganic insulating layer made of SiN was formed on the circuit substrate.

A photoresist-type ultraviolet-curable acrylic resin was applied to the inorganic insulating layer with a spin coater. A coating of the acrylic resin was exposed to light with an illuminance of 1,800 mW in such a manner that a photomask having a pattern for forming contact holes 111 and a planarization layer-separating region B was placed on the coating. The coating was developed and was then post-baked at 200° C., whereby a planarization layer 104 was formed. The planarization layer 104 had the contact holes 111 and the planarization layer-separating region B and also had a thickness of 2 μm. The planarization layer-separating region B was formed so as to extend from a position outwardly spaced from the periphery of the display region A at a distance of 350 μm and so as to have a width of 200 μm.

First electrodes 105 each including a laminate including an Al layer with a thickness of 100 nm and an IZO layer with a thickness of 50 nm were formed by a sputtering process. The first electrodes 105 were formed over the circuit substrate having the planarization layer 104 and were then patterned by photolithography so as to correspond to the pixel circuits 102. The first electrodes 105 were electrically connected to the pixel circuits 102 through the contact holes 111.

A polyimide resin was applied over the circuit substrate having the first electrodes 105 with a spin coater up to a thickness of 1.6 μm. Portions of the polyimide resin that were located in light-emitting regions of pixels or a bank-separating region B' were removed by photolithography, whereby a bank 106 was formed. The bank-separating region B' was formed such that end portions of the bank 106 were disposed at positions which were 5 μm apart from both lateral ends of the planarization layer-separating region B and which were located inside the planarization layer-separating region B. The bank-separating region B' had a width of 190 μm.

After the circuit substrate having the bank 106 was heated for ten minutes in an atmosphere having a temperature of 150° C. and a pressure of $10^{-2}$ Pa, organic compound layers 107 were formed on the first electrodes 105 arranged in the display region A. The organic compound layers 107 included hole transport sub-layers, organic light-emitting sub-layers, electron injection sub-layers, and electron transport sub-layers which were made of known organic materials, which were formed by a resistive heating evaporation process, and which were stacked.

A second electrode 108 made of IZO was formed over the organic compound layers 107 by a sputtering process. The second electrode 108 had a thickness of 50 nm and extended over the display region A.

An inorganic underlayer 202 was formed in the display region A by a chemical vapor deposition process using silicon nitride so as to have a thickness of 0.3 μm. A heat-curable epoxy resin with a viscosity of 3,000 mPa·s was applied to the inorganic underlayer 202 with an accurate graphic dispenser, SHOT MINI SL, available from Musashi Engineering, Inc. The epoxy resin was applied thereto in such a manner that a periphery drawn by a discharge port of the dispenser followed the lateral centerline of the bank-separating region B'. This allowed an end portion of a coating of the epoxy resin to be located in the bank-separating region B', which had a width of 190 μm. The epoxy resin coating was cured at 100° C. for 15 minutes in a vacuum, whereby an organic protective sub-layer 109 with a thickness of 30 μm was formed.

An inorganic protective sub-layer 110 made of silicon nitride was formed by a plasma-enhanced chemical vapor deposition process using a $SiH_4$ gas, an $N_2$ gas, and a $H_2$ gas. The inorganic protective sub-layer 110 had a thickness of 1 μm and extended over the organic protective sub-layer 109, the bank-separating region B', and the peripheral region C.

A display apparatus was manufactured as described above and was then subjected to a storage test in an atmosphere having a temperature of 60° C. and a relative humidity of 90%. As a result of carrying out the storage test for 1,000 hours, no dark spot was observed.

Example 2

FIGS. 3A and 3B show a display apparatus manufactured in this example. FIG. 3A is a plan view of the display apparatus. FIG. 3B is a sectional view of the display apparatus taken along the line IIIB-IIIB of FIG. 3A.

In this example, a planarization layer-separating region B was formed in the same manner as that described in Example 1. This example was different from Example 1 in that a bank was doubly separated and a bank portion remaining between bank-separating regions B'1 and B'2 was used as a three-dimensional structure 201 for determining the position of an end portion of an organic protective sub-layer. An inorganic protective sub-layer was a SiN layer, formed by a chemical vapor deposition process, having a thickness of 0.2 μm. Members denoted by the same reference numerals as those used in FIG. 1 were the same as those described in Example 1 and were formed in the same manner as that described in Example 1.

The bank-separating regions B'1 and B'2 had a width of 40 μm and were spaced from each other at a distance of 20 μm. A material used to form the organic protective sub-layer was stopped by the bank-separating region B'1, which was located on the display region side, and did not expand to the bank-separating region B'2.

The completed display apparatus was subjected to a storage test in an atmosphere having a temperature of 60° C. and a relative humidity of 90%. As a result of carrying out the storage test for 1,000 hours, no dark spot was observed.

Comparative Example

A display apparatus was manufactured in substantially the same manner as that described in Example 1 except that an organic protective sub-layer 109 was formed so as to have an end portion located outside a bank-separating region B' as shown in FIG. 4. The display apparatus was subjected to a storage test in an atmosphere having a temperature of 60° C. and a relative humidity of 90%. As a result of the storage test, about 20 enlarged dark spots were observed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-149054 filed Jun. 23, 2009, which is hereby incorporated by reference herein in its entirety.

What is claimed is:

1. A display apparatus comprising:
   a circuit substrate including a driving circuit;
   a planarization layer extending over the driving circuit;
   a plurality of organic light-emitting devices arranged on the planarization layer in a display region of the circuit substrate;
   a bank layer which is disposed on the planarization layer, which has a plurality of openings corresponding to light-emitting regions of the organic light-emitting devices, and which is made of an organic material;
   an organic protective layer which covers the display region and which is made of an organic material;
   an inorganic protective layer which covers the organic protective layer and which is made of an inorganic material;
   a planarization layer-separating region separating the planarization layer into a portion disposed in the display region and a portion disposed in a peripheral region; and
   a bank layer-separating region separating the bank layer into a portion disposed in the display region and a portion disposed in the peripheral region,
   wherein the bank layer-separating region is disposed in the planarization layer-separating region, the planarization layer has an end portion which extends along the bank layer-separating region and which is covered with the bank layer, an end portion of the organic protective layer is disposed in the bank layer-separating region spaced from the portion of the bank layer that is disposed in the peripheral region, and the inorganic protective layer extends over the end portion of the organic protective layer.

2. The display apparatus according to claim 1, further comprising a three-dimensional structure used to determine the position of an end portion of the organic protective layer, wherein the three-dimensional structure is spaced from the portion of the bank layer that is disposed in the peripheral region.

3. The display apparatus according to claim 2, wherein the three-dimensional structure is made of a material used to form the planarization layer or the bank layer, and the inorganic protective layer extends over the three-dimensional structure.

4. The display apparatus according to claim 1, further comprising an inorganic underlayer disposed between the organic protective layer and the organic light-emitting devices contained in the display region.

* * * * *